(12) United States Patent
Weiser

(10) Patent No.: US 8,564,335 B1
(45) Date of Patent: Oct. 22, 2013

(54) LOW POWER PAD

(75) Inventor: William B. Weiser, Meridian, ID (US)

(73) Assignee: Marvell International Ltd., Hamilton (BE)

( * ) Notice: Subject to any disclaimer, the term of this patent is extended or adjusted under 35 U.S.C. 154(b) by 96 days.

(21) Appl. No.: 13/243,459

(22) Filed: Sep. 23, 2011

Related U.S. Application Data

(60) Provisional application No. 61/393,649, filed on Oct. 15, 2010.

(51) Int. Cl.
*H03K 3/00* (2006.01)
(52) U.S. Cl.
USPC ............................................ 327/112; 326/58
(58) Field of Classification Search
USPC ......... 326/56, 57, 58; 327/108, 109, 111, 112
See application file for complete search history.

(56) References Cited

U.S. PATENT DOCUMENTS

| | | | | |
|---|---|---|---|---|
| 5,500,611 | A * | 3/1996 | Popat et al. | 326/87 |
| 6,448,812 | B1 * | 9/2002 | Bacigalupo | 326/83 |
| 7,254,728 | B2 * | 8/2007 | Rose et al. | 713/320 |
| 8,018,250 | B1 * | 9/2011 | Klein et al. | 326/56 |

* cited by examiner

*Primary Examiner* — Jeffrey Zweizig

(57) ABSTRACT

Aspects of the disclosure provide an integrated circuit (IC) chip. The IC chip includes core circuits having an operational mode and a power saving mode, and at least a pad module. The pad module includes a pad, a switchable pull-up module configured to pull up a voltage on the pad when the switchable pull-up module is switched on, a switchable pull-down module configured to pull down the voltage on the pad when the switchable pull-down module is switched on, and a control module configured to control the switchable pull-up module and the switchable pull-down module according to a detection of the voltage on the pad when the core circuits enter the power saving mode.

18 Claims, 5 Drawing Sheets

LOW POWER PAD

INCORPORATION BY REFERENCE

This present disclosure claims the benefit of U.S. Provisional Application No. 61/393,649, filed on Oct. 15, 2010, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, an integrated circuit chip includes a plurality of pads that couples internal circuits on the integrated circuit chip with external circuits that are outside of the integrated circuit chip. Some pads are input pads that receive inputs from the external circuits. Some pads are output pads that drive outputs to the external circuits. Some pads are general-purpose input/output (GPIO) pads that can be configured as input pads or output pads.

SUMMARY

Aspects of the disclosure provide an integrated circuit (IC) chip. The IC chip includes core circuits having an operational mode and a power saving mode, and at least a pad module. The pad module includes a pad, a switchable pull-up module configured to pull up a voltage on the pad when the switchable pull-up module is switched on, a switchable pull-down module configured to pull down the voltage on the pad when the switchable pull-down module is switched on, and a control module configured to control the switchable pull-up module and the switchable pull-down module according to a detection of the voltage on the pad when the core circuits enter the power saving mode.

In an embodiment, the pad module is configured as a general purpose input/output (GPIO) pad. In an example, the pad module includes an input buffer circuit configured to buffer an input based on the voltage on the pad and provide the input to the core circuits when the pad module is configured as an input pad, and a driver circuit configured to drive the voltage on the pad when the pad module is configured as an output pad.

In an embodiment, the core circuits are configured to read the input, and control the switchable pull-up module and the switchable pull-down module according to the input, for example, before the core circuits enter the power saving mode. Then, the control module is configured to maintain the control from the core circuits to the switchable pull-up module and the switchable pull-down module when the core circuits enter the power saving mode. In an example, the control module comprises at least a storage unit configured to store a value corresponding to the control from core circuits to the switchable pull-up module and the switchable pull-down module. Specifically, in an example, the control module includes a first latch configured to latch a pull-up control provided by the core circuits to the switchable pull-up module, and a second latch configured to latch a pull-down control provided by the core circuits to the switchable pull-down module.

In another embodiment, the control module includes a storage unit configured to store the detected voltage on the pad. In an example, the control module includes a flip-flop configured to sample the voltage on the pad in response to switching the core circuits into the power saving mode, and keep the sampled voltage when the core circuits are in the power saving mode.

According to an aspect of the disclosure, the control module includes a selector circuit configured to select the core circuits to control the switchable pull-up module and the switchable pull-down module when the core circuits are in the operational mode.

Aspects of the disclosure provide a method for configuring a pad coupled to core circuits on an integrated circuit (IC) chip. The method includes detecting a voltage on the pad in response to switching the core circuits into a power saving mode, and controlling a switchable pull-up module and a switchable pull-down module coupled to the pad according to the detected voltage when the core circuits stay in the power saving mode.

In an embodiment, the method also includes disabling an output driver circuit coupled to the pad to configure the pad as an input pad. To detect the voltage on the pad, the method includes enabling an input buffer circuit to buffer an input based on the voltage on the pad and provide the input to the core circuits before switching the core circuits into the power saving mode. Then, the method includes controlling the switchable pull-up module and the switchable pull-down module according to the input. In an example, the method includes storing at least a last control signal provided by the core circuits to control the switchable pull-up module and the switchable pull-down module when the core circuits stay in the power saving mode. Specifically, in an example, the method includes latching a pull-up control provided by the core circuits for controlling the switchable pull-up module in response to switching the core circuits into the power saving mode, and latching a pull-down control provided by the core circuits for controlling the switchable pull-down module in response to switching the core circuits into the power saving mode.

According to an aspect of the disclosure, the method includes sampling the voltage on the pad in response to switching the core circuits into the power saving mode, storing a value corresponding to the sampled voltage, and controlling the switchable pull-up module and the switchable pull-down module according to the stored value when the core circuits are in the power saving mode. Further, the method includes selecting the core circuits to control the switchable pull-up module and the switchable pull-down module when the core circuits are in an operational mode.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
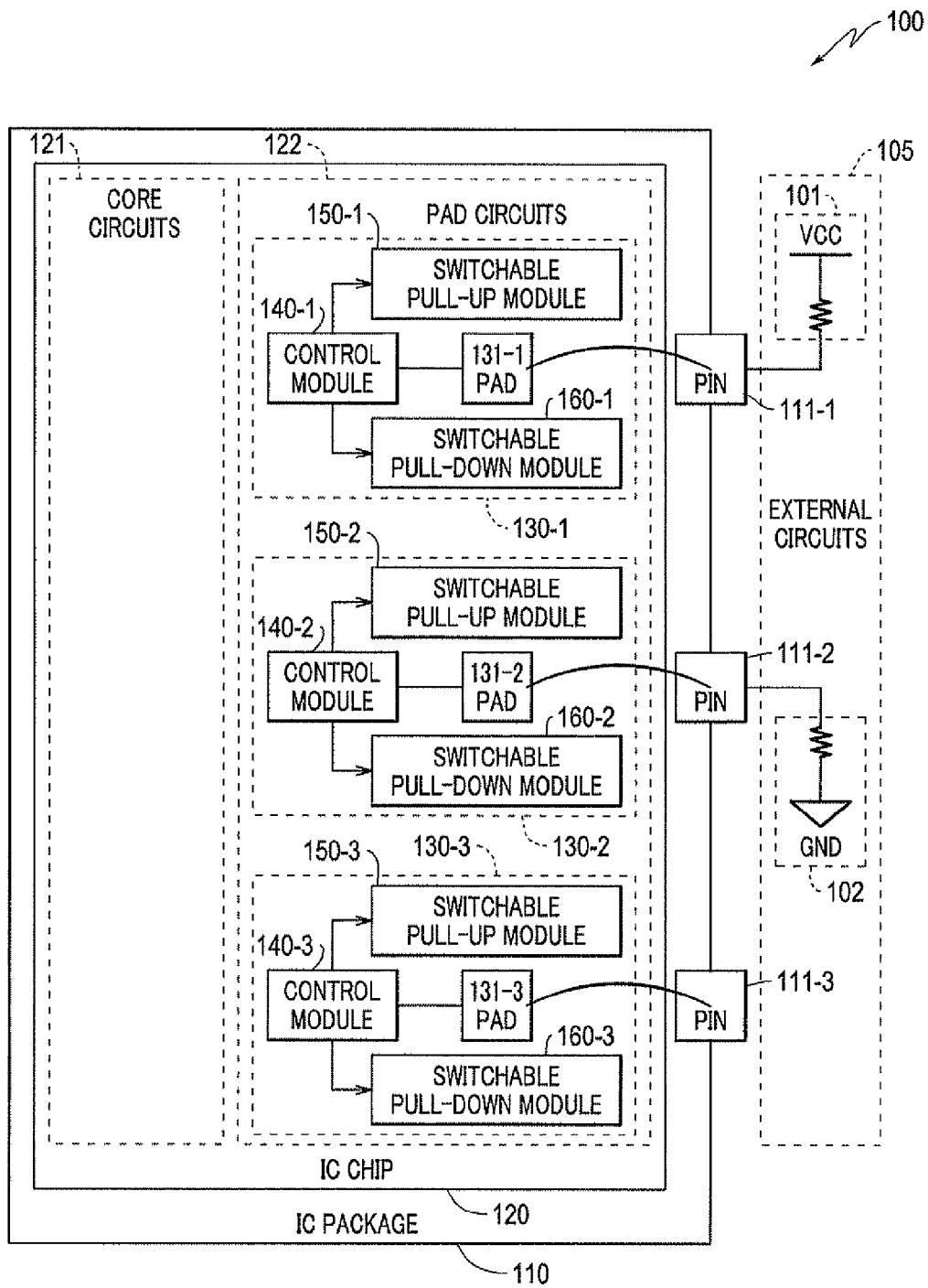
FIG. 1 shows a block diagram of a circuit example 100 according to an embodiment of the disclosure.

FIG. 1 shows a block diagram of an electronic device example 100 according to an embodiment of the disclosure. The electronic device 100 includes integrated circuits on an integrated circuit (IC) chip 120, and external circuits 105 that are outside of the IC chip 120. The IC chip 120 includes pads 131 that electrically couple the integrated circuits on the IC chip 120 with the external circuits 105.

The electronic device 100 can be any suitable device, such as handheld device, mobile phone, laptop computer, desktop computer, net book computer, electronic book, personal digital assistant (PDA), printer, facsimile machine, and the like. According to an aspect of the disclosure, the electronic device 100 has multiple power modes, such as an operational mode, and a power saving mode. In the power saving mode, elements of the electronic device 100 are suitably configured to save power. In an embodiment, when the electronic device 100 is idle for a time that is longer than a threshold, the electronic device 100 enters the power saving mode. In another embodiment, when a user pushes a button on the electronic device 100, the electronic device 100 enters the power saving mode.

Generally, the IC chip 120 is within an IC package 110. The IC package 110 includes a plurality of leads, such as pins 111, and the like. The pads 131 are respectively wire-bonded to the pins 111. Then, the pins 111 are electrically coupled to the external circuits 105. In an example, the electronic device 100 includes a printed circuit board (PCB) (not shown). The PCB includes conductive leads, such as metal wires, vias, jumpers, and the like. The IC package 110 and the external circuits 105 are mounted on the PCB, and are electrically coupled together by the conductive leads.

The external circuits 105 include any suitable components, such as other IC chips, discrete transistors, discrete resistors, discrete capacitors, discrete inductors, power sources, electric motors, switches, and the like.

The IC chip 120 includes core circuits 121 and pad circuits 122 that interface the core circuits 121 with the external circuits 105. In an embodiment, the core circuits 121 are placed in the center of the IC chip 120, and the pad circuits 122 form a pad ring around the core circuits 121. According to an aspect of the disclosure, when the electronic device 100 enters the power saving mode, the external circuits 105, the core circuits 121 and the pad circuits 122 are configured to reduce power consumption.

The core circuits 121 include any suitable circuit, such as digital circuits, analog circuits, processor, memory block, logic block, intellectual property (IP) block, and the like. The core circuits 121 have configurable power modes, such as an operational mode, a power off mode, and the like. In the operational mode, the core circuits 121 are able to perform any suitable functions, such as processing received signals from other circuits, providing control signals to other circuits, and the like. Generally, in the power saving modes, the core circuits 121 have limited processing capability, and may not provide suitable control signals to the other circuits. In an embodiment, when the core circuits 121 enters the power off mode, a portion of the core circuits 121 or the entire core circuits 121 are powered off to save power. It is noted that the core circuits 121 can have other suitable power saving modes, such as a reduced voltage mode, a reduced frequency mode, and the like.

The pad circuits 122 include a plurality of pad modules, such as pad modules 130, and the like. In an embodiment, when the core circuits 121 are in the operational mode, the core circuits 121 provide suitable signals, such as pull-up/pull-down control signals, output signals, and the like to the pad circuits 122. When the core circuits 121 enter a power saving mode, such as being powered off, the pad modules 130 are not powered off, but are suitably configured to reduce power consumption. For example, the pad modules 130 are configured to automatically pull up or pull down voltages on pads based on previous states of the pads before the core circuits 121 are powered off. Thus, the pad circuits 122 are configured to avoid leakages due to floating voltages or mismatches to external circuits 105, for example. It is noted that the pad circuits 122 can include other pad modules (not shown) that are configured differently from the pad modules 130.

Specifically, a pad module 130 includes a pad 131, a switchable pull-up module 150 and a switchable pull-down module 160 coupled to the pad 131, and a control module 140 that controls the switchable pull-up module 150 and the switchable pull-down module 160. It is noted that the pad module 130 can have other suitable circuit, such as input buffer circuit (not shown), output driver circuit (not shown), and the like.

In an embodiment, when the core circuits 121 are in the operational mode, the core circuits 121 provide control signals to the pad modules 130 to switch on or off the switchable pull-up module 150 and the switchable pull-down module 160. When the core circuits 121 are configured into a power saving mode, such as being powered off, the control module 140 provides control signals to the switchable pull-up module 150 and the switchable pull-down module 160.

In an example, the pad modules 130 are general-purpose input/output (GPIO) pad modules that can be configured as input pad modules or output modules. When the core circuits 121 are configured into the operational mode, the core circuits 121 provide suitable control signals to the pad modules 130 to suitably configure the pad module 130 as input pad modules or output pad modules. For example, the core circuits 121 provide control signals to configure the pad module 130-1 as an output pad module, the pad module 130-2 as an input pad module, and the pad module 130-3 as being not in use.

It is noted that the external circuits 105 also include different circuits coupled to the pad modules 130 when the pad modules 130 are configured differently. For example, the pad module 130-1 is an output pad module that drives an electric motor. In an example, the pad module 130-1 is coupled to a pull-up circuit 101 that is external of the IC chip 120 to enable a relatively high voltage on the pad 131-1, for example, in the power saving mode to avoid malfunction by the electric motor. The pad module 130-2 is coupled to a pull-down circuit 102 that is external of the IC chip 120 to enable a relatively low voltage on the pad 131-2, for example, in the power saving mode to avoid a floating intermediate voltage that can cause an input circuit leakage. It is noted that the external circuits 105 may not have external pull-up circuit or pull-down circuit for some pads, such as the pad module 130-3 in the FIG. 1 example.

It is also noted that the configurations of the external pull-up/pull-down circuits depend on a system engineer that puts the IC chip 120 and the external circuits 105 together at a back-end design of the electronic device 100. In an example, a system engineer relies on the internal pull-up/pull-down circuit, and does not add external pull-up/pull-down circuits. In another example, another system engineer adds the external pull-up/pull-down circuits. Generally, the configurations of the external pull-up/pull-down circuits at the back-end are not available to a chip designer that designs the internal pull-up/pull-down circuits for the pad modules 130.

According to an embodiment of the disclosure, when the core circuits 121 are configured into the operational mode, the core circuits 121 suitably determine the control signals to the pad modules 130 to enable suitable voltage pull-up/pull-down at the pads 131. For example, the core circuits 121 provide control signals to the pad module 130-1 to switch on the switchable pull-up module 150-1 and switch off the switchable pull-down module 160-1 to provide voltage pull up for the pad 131-1. In another example, the core circuits 121 provide control signals to the pad module 130-2 to switch off the switchable pull-up module 150-2 and switch on the switchable pull-down module 160-2 to provide voltage pull-down for the pad 131-2. In addition, the core circuits 121 provide control signals to the pad module 130-3 to switch on only one of the switchable pull-up module 150-2 and the switchable pull-down module 160-3 to avoid an intermediate voltage on the pad 131-3.

According to an aspect of the disclosure, when the electronic device 100 enters the power saving mode, the core circuits 121 are configured to save power, and the pad modules 130 are configured as input pad modules to save power. In addition, the control modules 140 provide the control signals to switch on or off the switchable pull-up modules 150 and the switchable pull-down modules 160 to avoid current leakage due to intermediate voltage potentials on the pads 131.

In an embodiment, the control modules 140 include storage unit (not shown) configured to store control signals that are previously used before the core circuits 121 enter the power saving mode, and to maintain the previous control signals. In another embodiment, the control modules 140 include detection circuit to detect the state of the pads 131 at the time the core circuits 121 enter the power saving mode. Then, the control modules 140 provide the control signals based on the detected state.

In an example, at the time the core circuits 121 enter the power saving mode, due to the pull up circuit 101, the voltage on the pad 131-1 is larger than a threshold, such as a medium value of a power supply (VCC) and ground (GND), thus the control module 140-1 detects that the pad 131-1 is in a high state, for example. Similarly, at the time the core circuits 121 enter the power saving mode, due to the pull-down circuit 102, the voltage on the pad 131-2 is smaller than a threshold, such as the medium value of VCC and GND, thus, the control module 140-2 detects that the pad 131-2 is in a low state, for example. It is noted that because the pad module 130-3 is not coupled to external pull-up/pull down circuit, at the time the core circuits 121 enter the power saving mode, the voltage on the pad 131-3 can be higher than the threshold or lower than the threshold.

After the core circuit 121 enters the power saving mode, the control module 140-1 switches on the switchable pull-up module 150-1, and switches off the switchable pull-down module 160-1 to pull up the voltage on the pad 131-1. Thus, the configuration of the internal pull-up/pull-down circuit of the pad module 130-1 matches the external pull-up circuit 101. Thus, no leakage current path is formed from VCC to GND. In a comparison example, when the internal pull/up/pull-down circuit does not match the external pull-up/pull down circuit, for example, when pad 131-1 is coupled to an internal pull-down circuit, a leakage current path is formed from VCC to GND by the external pull-up circuit 101 and the internal pull-down circuit. The leakage current path causes, for example, leakage current in the order of 50 µA per pad.

Similarly, After the core circuit 121 enters the power saving mode, the control module 140-2 switches off the switchable pull-up module 150-2, and switches on the switchable pull-down module 160-2 to pull down the voltage on the pad 131-2. Thus, the configuration of the internal pull-up/pull-down circuit of the pad module 130-2 matches the external pull-down circuit 102. Thus, no leakage current path is formed from VCC to GND.

For the pad module 130-3, it doesn't matter whether the control module 140-3 switches on the switchable pull-up module 150-3 or the switchable pull-down module 160-3. As long as only one of the switchable pull-up module 150-3 and the switchable pull-down module 160-3 is switched on, the voltage on the pad 131-3 is not at an intermediate level, leakage current in the input buffer circuit due to the intermediate voltage can be reduced.

Figure 2:
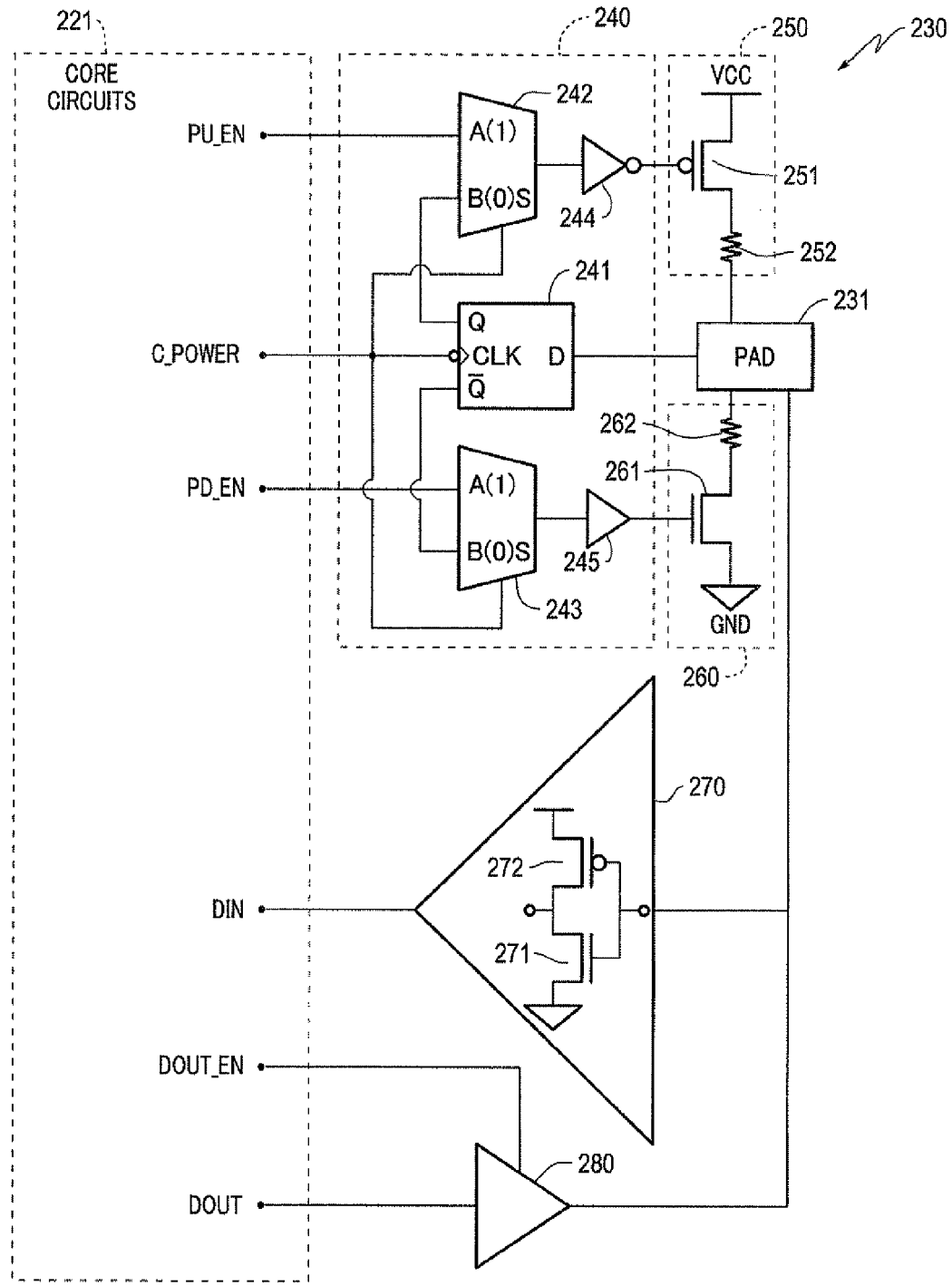
FIG. 2 shows a block diagram of a pad module example 230 according to an embodiment of the disclosure.

FIG. 2 shows a block diagram of a pad module example 230 according to an embodiment of the disclosure. The pad module 230 is a general-purpose input/output (GPIO) pad module that can be configured as input pad module or output pad module. Specifically, the pad module 230 includes a pad 231, a switchable pull-up module 250, a switchable pull-down module 260, a control module 240, an input buffer circuit 270, and an output driver circuit 280. These elements are coupled together as shown in FIG. 2.

The pad module 230 is coupled to core circuits 221. In the FIG. 2 example, when the core circuits 221 provide a control signal DOUT_EN to disable the output driver circuit 280, the pad module 230 is configured as an input pad module. The input buffer circuit 270 buffers an input DIN received from external circuits via the pad 231, and provides the input DIN to the core circuits 221. When the core circuits 221 provide the control signal DOUT_EN to enable the output driver circuit 280, the pad module 230 is configured as an output pad module. The core circuits 221 provide a data signal DOUT to the output driver circuit 280 to drive to the external circuits.

In the FIG. 2 example, the core circuits 221 also provide a pull-up control signal PU_EN and a pull-down control signal PD_EN to the control the switchable pull-up module 250 and the switchable pull-down module 260. In addition, the core circuits 221 provide a power control signal C_POWER to the control module 240 to shift the pull-up/pull-down control to the control module 240.

In an embodiment, the switchable pull-up module 250 includes a switch, such as a P-type metal-oxide-silicon (MOS) transistor 251, and a resistor 252 coupled in series between a power supply (VCC) and the pad 231. When the P-type MOS transistor 251 is switched on, the switchable pull-up module 250 pulls up the voltage on the pad 231. It is noted that other suitable switchable pull-up module is also contemplated.

In an embodiment, the switchable pull-down module 260 includes a switch, such as an N-type MOS transistor 261, and a resistor 262 coupled in series between the pad 231 and a ground supply (GND). When the N-type MOS transistor 261 is switched on, the switchable pull-down module 260 pulls down the voltage on the pad 231. It is noted that other suitable switchable pull-down module is also contemplated.

In an embodiment, when the core circuits 221 enter a power saving mode, such as being powered off, the pad module 230 is not powered off, but is configured into the input pad module to save power. In addition, the voltage on the pad 231 is pulled-up or pulled-down to avoid an intermediate voltage level that can cause relatively large current leakage in the input buffer circuit 270.

In an example, the input buffer circuit 270 includes an N-type MOS transistor 271 and a P-type MOS transistor 272 coupled together in a complementary MOS (CMOS) configuration. When the voltage on the pad 231 is high or low, one of the N-type MOS transistor 271 and the P-type MOS transistor 272 is turned off, thus little current flows through. However, when the voltage on the pad 231 floats at an intermediate level, such as about the medium of the VCC and GND, both the N-type MOS transistor 271 and the P-type MOS transistor 272 conduct current, thus a leakage current flows through the P-type MOS transistor 272 and the N-type MOS transistor 271.

In an embodiment, when the core circuits 221 are in the operational mode, the core circuits 221 provide the pull-up control signal PU_EN and the pull-down control signal PD_EN to switch on or off the switchable pull-up module 250 and the switchable pull-down module 260. However, when the core circuits 221 enter the power saving mode, such as being powered off, the core circuits 221 may not still be able to appropriately provide the pull-up control signal PU_EN and the pull-down control signal PD_EN. In an embodiment, the control module 240 then provides control signals to control the switchable pull-up module 250 and the switchable pull-down module 260.

In an example, the control module 240 includes a D flip-flop 241, a first multiplexer 242, a second multiplexer 243, an inverter 244, a buffer 245. These elements are coupled together as shown in FIG. 2. When the core circuits 221 are in the operational mode, the power control signal C_POWER is high, the first multiplexer 242 selects the pull-up control signal PU_EN to control the switchable pull-up module 250. Similarly, the second multiplexer 243 selects the pull-down control signal PD_EN to control the switchable pull-down module 260.

At the time the core circuits 221 enter the power saving mode, the power control signal C_POWER falls down. The falling edge transition of the power control signal C_POWER triggers the D flip-flop 241 to sample the voltage on the pad 231 and generate flip-flop output signals (Q and $\overline{Q}$) based on the sampled voltage.

When the core circuits 221 stay in the power saving mode, the power control signal C_POWER keeps low. The D flip-flop 241 locks the flip-flop output signals Q and $\overline{Q}$. In addition, the first multiplexer 242 selects the output signal Q of the D flip-flop 241 to control the switchable pull-up module 250, and the second multiplexer 243 selects the output signal $\overline{Q}$ of the D flip-flop 241 to control the switchable pull-down module 260.

In an example, the pad module 230 is configured as an output pad module that the control signal DOUT_EN enables the output driver circuit 280 and is coupled to an external pull-up circuit (not shown). When the core circuits 221 are in the operational mode, the power control signal C_POWER is high, the pull-up control signal PU_EN is low, and the pull-down control signal PD_EN is low.

The first multiplexer 242 selects the pull-up control signal PU_EN to control the switchable pull-up module 250. The inverter 244 inverts the output signal of the multiplexer 242. Thus, the voltage on the gate terminal of the P-type MOS transistor 251 is high, and the P-type MOS transistor 251 is turned off to switch off the switchable pull-up module 250. The second multiplexer 243 selects the pull-down control signal PD_EN to control the switchable pull-down module 260. The N-type MOS transistor 261 is turned off to switch off the switchable pull-down module 260. It is noted that, in another example, the pull-up control signal PU_EN is high to switch on the switchable pull-up module 250.

At the time the core circuits 221 enter the power saving mode, the control signal DOUT_EN disables the output driver circuit 280, and the pad module 230 is configured as an input pad module. Due to the external pull-up circuit, the voltage on the pad 231 is relatively high. Further, the power control signal C_POWER falls down. The falling edge transition of power control signal C_POWER triggers the D flip-flop 241 to sample the voltage on the pad 231 that is relatively high and generate the output signal Q to be binary "1" and the output signal $\overline{Q}$ to be binary "0" based on the sampled voltage.

When the core circuits 221 stay in the power saving mode, the power control signal C_POWER keeps low. The D flip-flop 241 locks the flip-flop output signal Q and $\overline{Q}$ In addition, the first multiplexer 242 selects the output signal Q of the D flip-flop 241, which is binary "1", to control the switchable pull-up module 250, and the second multiplexer 243 selects the output signal $\overline{Q}$ of the D flip-flop 241, which is binary "0", to control the switchable pull-down module 260. Thus, the P-type MOS transistor 251 is turned on to pull up the voltage on the pad 231, and the N-type MOS transistor 261 is turned off to switch off the switchable pull-down module 260.

In another example, the pad module 230 is configured as an input pad module that the control signal DOUT_EN disables the output driver circuit 280 and is coupled to an external pull-down circuit (not shown). When the core circuits 221 are in the operational mode, the power control signal C_POWER is high, the pull-up control signal PU_EN is low, and the pull-down control signal PD_EN is high.

The first multiplexer 242 selects the pull-up control signal PU_EN to control the switchable pull-up module 250. The inverter 244 inverts the output signal of the multiplexer 242. Thus, the voltage on the gate terminal of the P-type MOS transistor 251 is high, and the P-type MOS transistor 251 is turned off to switch off the switchable pull-up module 250. The second multiplexer 243 selects the pull-down control signal PD_EN to control the switchable pull-down module 260. The N-type MOS transistor 261 is turned on to switch on the switchable pull-down module 260 to pull down the voltage on the pad 231.

At the time the core circuits 221 enter the power saving mode, the pad module 230 stays as the input pad module. Due to the external pull-down circuit, and the internal pull-down circuit, the voltage on the pad 231 is relatively low. Further, the power control signal C_POWER falls down. The falling edge transition of power control signal C_POWER triggers the D flip-flop 241 to sample the voltage on the pad 231 that is relatively low and generate the output signal Q to be binary "0" and the output signal $\overline{Q}$ to be binary "1" based on the sampled voltage.

When the core circuits 221 stay in the power saving mode, the power control signal C_POWER keeps low. The D flip-flop 241 locks the flip-flop output signal Q and $\overline{Q}$ In addition, the first multiplexer 242 selects the output signal Q of the D flip-flop 241, which is binary "0", to control the switchable pull-up module 250, and the second multiplexer 243 selects the output signal $\overline{Q}$ of the D flip-flop 241, which is binary "1", to control the switchable pull-up module 260. Thus, the P-type MOS transistor 251 is turned off to switch off the switchable pull-up module 250, and the N-type MOS transistor 261 is turned on to switch on the switchable pull-down module 260 to pull down the voltage on the pad 231.

It is noted that the control module 240 can be suitably adjusted.

Figure 3:
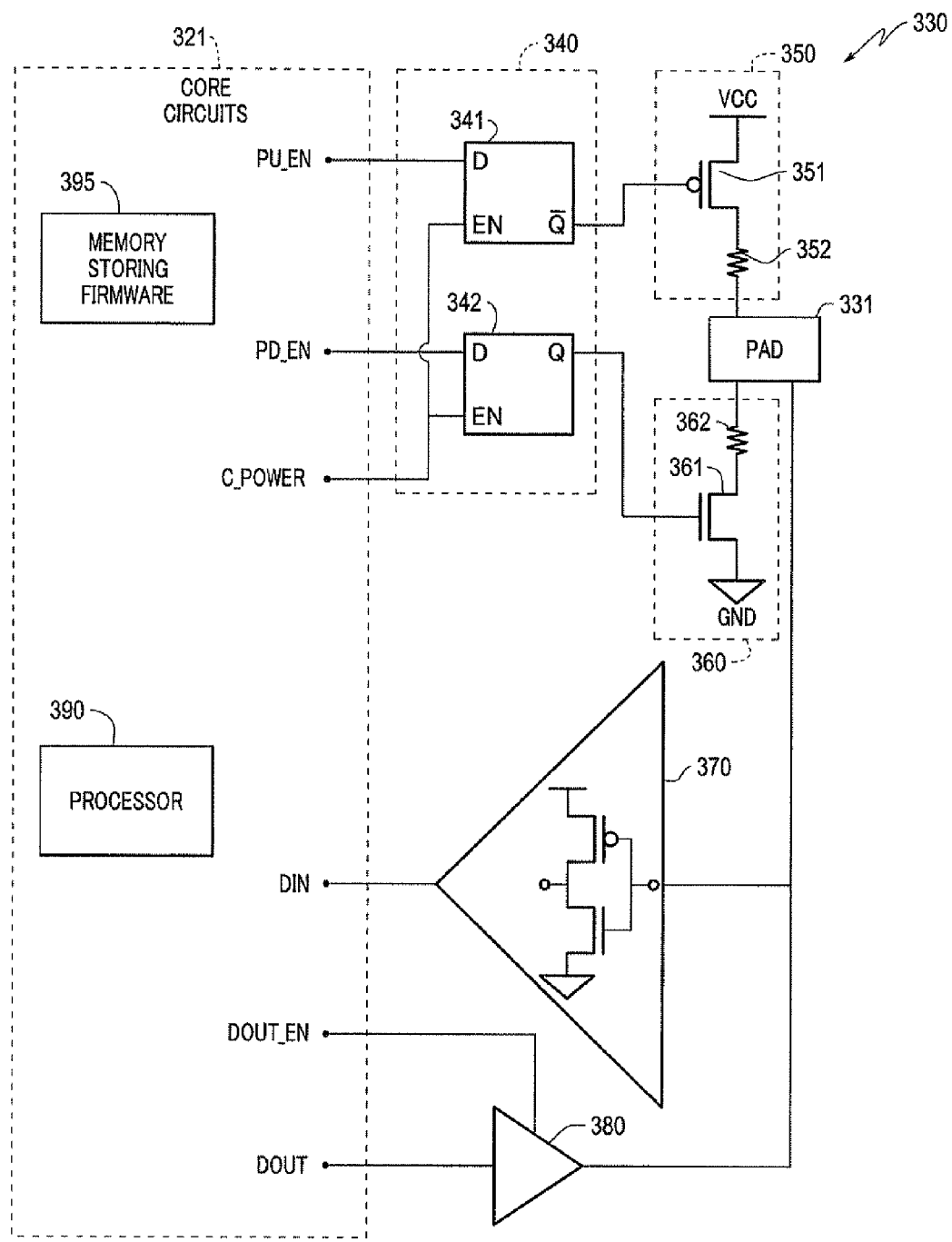
FIG. 3 shows a block diagram of another pad module example 330 according to an embodiment of the disclosure.

FIG. 3 shows a block diagram of another pad module example 330 according to an embodiment of the disclosure. The pad module 330 is a general-purpose input/output pad module that can be configured as input pad module or output pad module. Specifically, the pad module 330 includes a pad 331, a switchable pull-up module 350, a switchable pull down module 360, a control module 340, an input buffer circuit 370, and an output driver circuit 380.

The pad module 330 utilizes certain components that are identical or equivalent to those used in the pad module 230; the description of these components has been provided above and will be omitted here for clarity purposes.

The control module 340 includes a first D latch 341 and a second D latch 342. When the core circuits 221 are in the operational mode, the power control signal C_POWER is high, the first D latch 341 is configured as a transparent latch and the switchable pull-up module 350 is controlled based on the pull-up control signal PU_EN. Similarly, the second D latch 342 is configured as a transparent latch, and the switchable pull-down module 360 is controlled based on the pull-down control signal PU_EN.

At the time the core circuits 221 enter the power saving mode, the power control signal C_POWER is low, the first D latch 341 latches the last provided pull-up control signal PU_EN, and the switchable pull-up module 350 is controlled based on the latched pull-up control signal PU_EN. Similarly, the second D latch 342 latches the last provided pull-down control signal PD_EN, and the switchable pull-down module 360 is controlled based on the latched pull-down signal PD_EN.

According to an embodiment of the disclosure, the core circuits 321 includes a processor 390, and a memory 395 configured to store code instructions, such as firmware, and the like. The processor 390 executes the code instructions to provide the pull-up control signal PU_EN and the pull-down control signal PD_EN before the core circuits 321 enter the power saving mode.

During operation, in an example, the pad module 330 is configured as an output pad module and is coupled to an external pull-up circuit (not shown). When the core circuits 321 are in the operational mode, the power control signal C_POWER is high, the pull-up control signal PU_EN is low, and the pull-down control signal PD_EN is low.

The first D latch 341 and the second D latch 342 are configured as transparent latches, such that the switchable pull up module 350 and the switchable pull-down module 360 are controlled based on the pull-up control signal PU_EN and the pull-down control signal PD_EN. The P-type MOS transistor 251 is turned off to switch off the switchable module 250. The N-type MOS transistor 261 is turned off to switch off the switchable pull-down module 260.

When a decision is made to switch the core circuits 321 into a power saving mode, the processor 390 executes the firmware stored in the memory 395 to suitably determine and provide the pull-up control signal PU_EN and PD_EN. Specifically, the processor 390 provides the control signal DOUT_EN to disable the output driver circuit 380, to configure the pad module 330 as an input pad module. Further, the processor 390 reads the input data DIN. Due to the external pull-up circuit, the voltage on the pad 331 is relatively high, thus the input data DIN is binary "1". Then, the processor 390 provides binary "1" as the pull-up control signal PU_EN to switch on the switchable pull-up module 350 and provides binary "0" as the pull-down control signal PD_EN to switch off the switchable pull-down module 360.

Then, the core circuits 321 enter the power saving mode, the power control signal C_POWER falls low. The first D latch 341 latches the last provided pull-up control signal PU_EN which is binary "1", and the second D latch 342 latches the last provided pull-down control signal PD_EN which is binary "0". Thus, the switchable pull-up module 350 is switched on to pull up the voltage on the pad 331, and the switchable pull-down module 360 is switched off.

In another example, the pad module 330 is configured as an input pad module and is coupled to an external pull-down circuit (not shown). When the core circuits 321 are in the operational mode, the power control signal C_POWER is high, the pull-up control signal PU_EN is low, and the pull-down control signal PD_EN is high, for example.

The first D latch 341 and the second D latch 342 are configured as transparent latches, such that the switchable pull-up module 350 and the switchable pull-down module 360 are controlled based on the pull-up control signal PU_EN and the pull-down control signal PD_EN. The P-type MOS transistor 251 is turned off to switch off the switchable pull-up module 250. The N-type MOS transistor 261 is turned on to switch on the switchable pull-down module 260 to pull down the voltage on the pad 331.

When a decision is made to switch the core circuits 321 into a power saving mode, the processor 390 executes the firmware stored in the memory 395 to suitably determine and provide the pull-up control signal PU_EN and PD_EN. Specifically, the processor 390 reads the input data DIN. Due to the external pull-down circuit, the voltage on the pad 331 is relatively low, thus the input data DIN is binary "0". Then, the processor 390 provides binary "0" as the pull-up control signal PU_EN to switch off the switchable pull-up module 350 and provides binary "1" as the pull-down control signal PD_EN to switch on the switchable pull-down module 360.

Then, the core circuits 321 enter the power saving mode, the power control signal C_POWER falls low. The first D latch 341 latches the last provided pull-up control signal PU_EN which is binary "0", and the second D latch 342 latches the last provided pull-down control signal PD_EN which is binary "1". Thus, the switchable pull-up module 350 is switched off, and the switchable pull-down module 360 is switched on to pull down the voltage on the pad 331.

Figure 4:
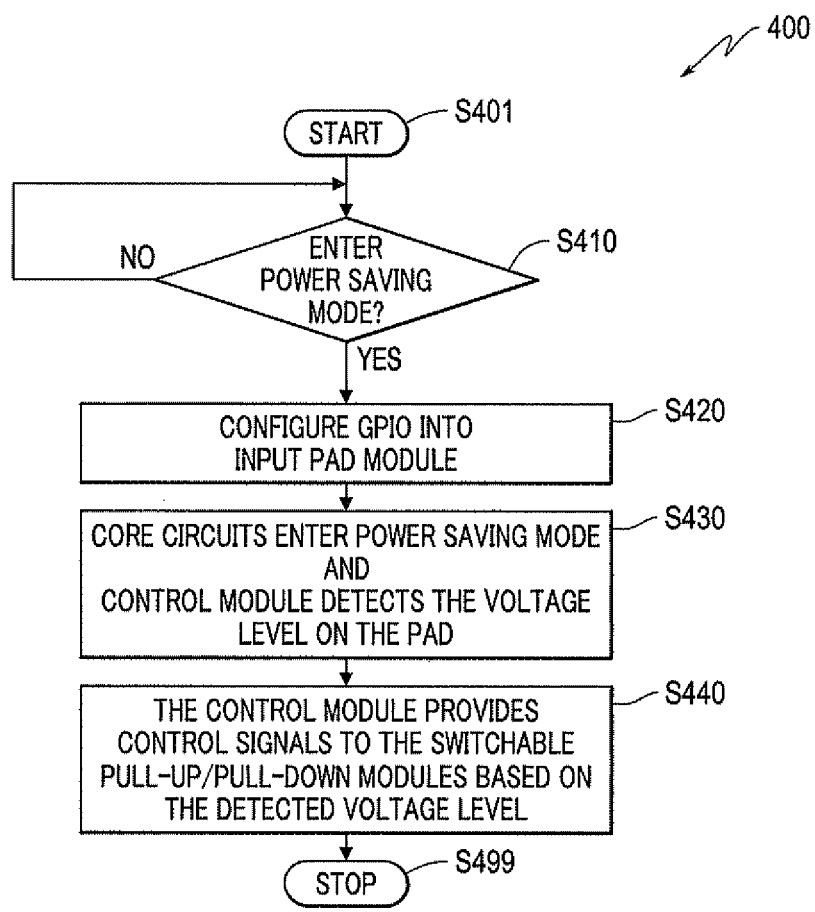
FIG. 4 shows a flow chart outlining a process example 400 executed by an electronic device having the pad module 230 according to an embodiment of the disclosure.

FIG. 4 shows a flow chart outlining a process example 400 executed by an electronic device having the pad module 230 according to an embodiment of the disclosure. The process starts at S401, and proceeds to S410.

At S410, the electronic device determines whether it is appropriate for the electronic device to enter a power saving mode. When the electronic device determines that the electronic device can enter the power saving mode, the process proceeds to S420; otherwise, the process returns to S410.

At S420, the core circuits 221 configure the pad module 230 as input pad module.

At S430, the core circuits 221 enters the power saving mode. At the time the core circuits 221 enters the power saving mode, the control module 240 detects the voltage level on the pad 231 and locks data corresponding to the voltage level.

At S440, the control module 240 provides the control signals to the switchable pull-up module 250 and switchable pull-down module 260 based on the detected voltage level on the pad 231. Then, the process proceeds to S499 and terminates.

Figure 5:
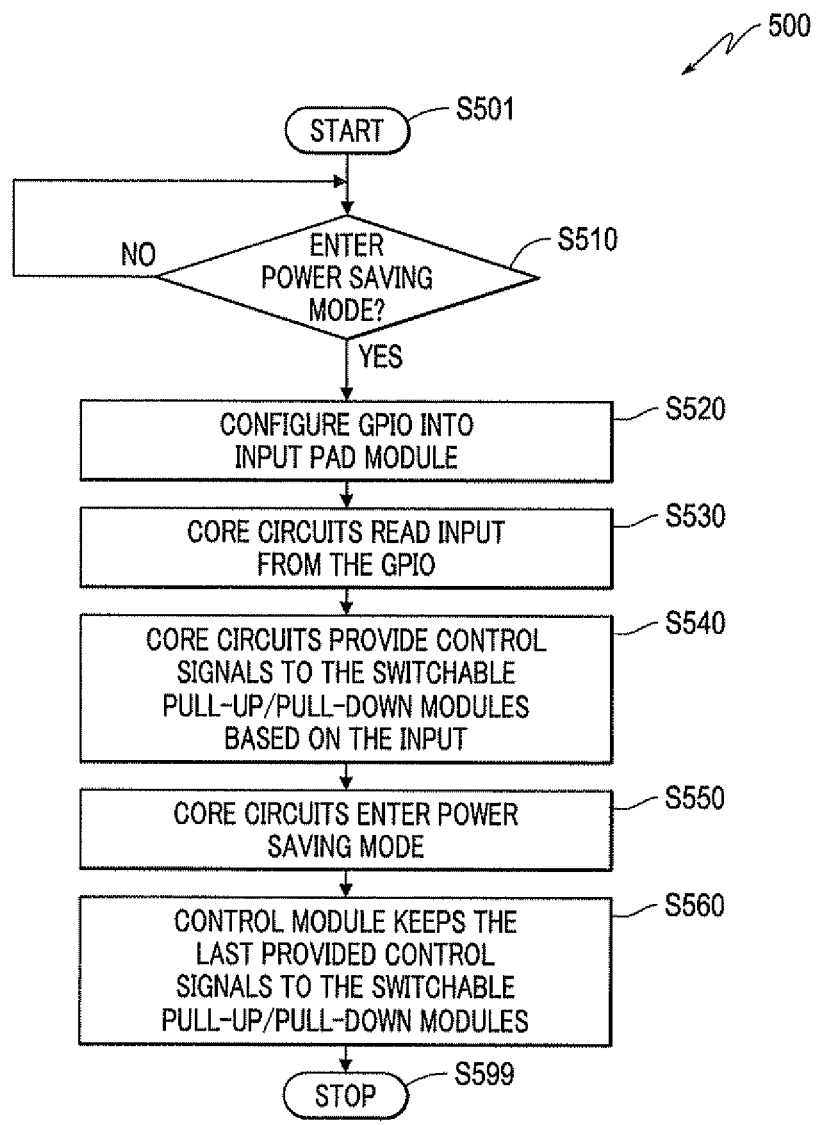
FIG. 5 shows a flow chart outlining a process example 500 executed by an electronic device having the pad module 330 according to an embodiment of the disclosure.

FIG. 5 shows a flow chart outlining a process example 500 executed by an electronic device having the pad module 330 according to an embodiment of the disclosure. The process starts at S501, and proceeds to S510.

At S510, the electronic device determines whether it is appropriate for the electronic device to enter a power saving mode. When the electronic device determines that the electronic device can enter the power saving mode, the process proceeds to S520; otherwise, the process returns to S510.

At S520, the core circuits 321 configure the pad module 330 as input pad module.

At S530, the core circuits 321 read input from the pad module 330.

At S540, the core circuits 321 provide control signals to the switchable pull-up module 350 and switchable pull-down module 360 based on the input.

At S550, the core circuits 321 enter the power saving mode.

At S560, the control module 340 latches the last provided control signals to the switchable pull-up module 350 and the switchable pull-down module 360. The process proceeds to S599 and terminates.

It is noted that the process 500 can be suitably modified for multiple pad modules 330. In an example, at S520, the core circuits 321 configured the multiple pad modules 330 as input modules; at S530, the core circuits 321 serially read the multiple pad modules 330; at S540, the core circuits 321 serially provide control signals respectively to the multiple pad modules 330.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit (IC) chip, comprising:
   core circuits having an operational mode and a power saving mode; and a pad module that includes:
   a pad;
   a switchable pull-up module configured to pull up a voltage on the pad when the switchable pull-up module is switched on;
   a switchable pull-down module configured to pull down the voltage on the pad when the switchable pull-down module is switched on; and
   a control module configured to control each of the switchable pull-up module and the switchable pull-down module according to a detection of a voltage on the pad when the core circuits enter the power saving mode, the control module including a selector circuit configured to select the core circuits to control the switchable pull-up module and the switchable pull-down module when the core circuits are in the operational mode.

2. The IC chip of claim 1, wherein the pad module is configured as a general purpose input/output pad.

3. The IC chip of claim 1, wherein the pad module further comprises:
   an input buffer circuit configured to buffer an input based on the voltage on the pad and provide the input to the core circuits.

4. The IC chip of claim 3, wherein the core circuits are configured to read the input, and send at least one control signal to the switchable pull-up module and the switchable pull-down module according to the input.

5. The IC chip of claim 4, wherein the control module is configured to maintain at least a last control signal from the core circuits to the switchable pull-up module and the switchable pull-down module when the core circuits enter the power saving mode.

6. The IC chip of claim 5, wherein the control module comprises at least a storage unit configured to store the last control signal from core circuits to the switchable pull-up module and the switchable pull-down module.

7. The IC chip of claim 6, wherein the control module comprises:
   a first latch configured to latch a last pull-up control provided by the core circuits to the switchable pull-up module when the core circuits enter the power saving mode; and
   a second latch configured to latch a last pull-down control provided by the core circuits to the switchable pull-down module when the core circuits enter the power saving mode.

8. The IC chip of claim 1, wherein the pad module further comprises:
   a driver circuit configured to drive the voltage on the pad when the pad module is configured as an output pad.

9. The IC chip of claim 1, wherein the control module further comprises:
   a storage unit configured to store the detected voltage on the pad.

10. The IC chip of claim 9, wherein the control module further comprises:
    a flip-flop configured to sample the voltage on the pad in response to switching the core circuits into the power saving mode, and keep the sampled voltage when the core circuits are in the power saving mode.

11. The IC chip of claim 1, wherein a portion of the core circuits is powered off when the core circuits enter the power saving mode.

12. A method, comprising:
    detecting a voltage on a pad that is coupled to core circuits on an integrated circuit (IC) chip in response to switching the core circuits into a power saving mode;
    controlling a switchable pull-up module and a switchable pull-down module coupled to the pad according to the detected voltage when the core circuits stay in the power saving mode; and
    selecting the core circuits to control the switchable pull-up module and the switchable pull-down module when the core circuits are in an operational mode.

13. The method of claim 12, wherein detecting the voltage on the pad further comprises:
    enabling an input buffer circuit to buffer an input based on the voltage on the pad, and providing the input to the core circuits before switching the core circuits into the power saving mode.

14. The method of claim 13, wherein controlling the switchable pull-up module and the switchable pull-down module coupled to the pad according to the detected voltage further comprises:
    controlling the switchable pull-up module and the switchable pull-down module according to the input.

15. The method of claim 14, further comprising:
    storing at least one control signal provided by the core circuits to control the switchable pull-up module and the switchable pull-down module when the core circuits stay in the power saving mode.

16. The method of claim 15, further comprising:
    latching a pull-up control provided by the core circuits for controlling the switchable pull-up module in response to switching the core circuits into the power saving mode; and
    latching a pull-down control provided by the core circuits for controlling the switchable pull-down module in response to switching the core circuits into the power saving mode.

17. The method of claim 12, further comprising:
    disabling an output driver circuit coupled to the pad to configure the pad as an input pad.

18. The method of claim 12, wherein detecting the voltage on the pad further comprises:

sampling the voltage on the pad in response to switching the core circuits into the power saving mode; and storing a value corresponding to the sampled voltage when the core circuits are in the power saving mode.

\* \* \* \* \*